US009832859B2

United States Patent
Lee et al.

(10) Patent No.: US 9,832,859 B2
(45) Date of Patent: Nov. 28, 2017

(54) PRINTED CIRCUIT BOARD ASSEMBLY AND METHOD OF MANUFACTURING THE SAME

(71) Applicant: Samsung Electronics Co., Ltd., Suwon-si (KR)

(72) Inventors: Yong Won Lee, Suwon-si (KR); Hyun-Tae Jang, Anyang-si (KR); Jung Je Bang, Gumi-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 119 days.

(21) Appl. No.: 14/813,448

(22) Filed: Jul. 30, 2015

(65) Prior Publication Data

US 2016/0044835 A1    Feb. 11, 2016

(30) Foreign Application Priority Data

Aug. 8, 2014    (KR) .................. 10-2014-0102546

(51) Int. Cl.
| | |
|---|---|
| *H05K 7/00* | (2006.01) |
| *H05K 1/02* | (2006.01) |
| *G06F 1/18* | (2006.01) |
| *H05K 9/00* | (2006.01) |
| *H05K 1/18* | (2006.01) |

(52) U.S. Cl.
CPC ............. *H05K 1/0216* (2013.01); *G06F 1/18* (2013.01); *H05K 9/0032* (2013.01); *H05K 1/181* (2013.01); *H05K 2201/09972* (2013.01); *H05K 2201/10371* (2013.01)

(58) Field of Classification Search
USPC ........................................ 361/760, 816, 818
See application file for complete search history.

(56) References Cited

U.S. PATENT DOCUMENTS

| | | | | |
|---|---|---|---|---|
| 2009/0207578 | A1* | 8/2009 | Ligtenberg | G06F 1/1616 361/818 |
| 2014/0215805 | A1* | 8/2014 | Zhang | H05K 1/0218 29/593 |

FOREIGN PATENT DOCUMENTS

| | | |
|---|---|---|
| JP | 2010-103375 | 5/2010 |
| KR | 10-1424723 | 8/2014 |

OTHER PUBLICATIONS

Korean Office Action dated Apr. 15, 2016 in Korean Patent Application No. 10-2014-0102546.
Korean Office Action dated Nov. 3, 2016 in Korean Patent Application No. 10-2014-0102546.
Korean Office Action dated Aug. 30, 2016 in Korean Patent Application No. 10-2014-0102546.

* cited by examiner

*Primary Examiner* — Andargie M Aychillhum
(74) *Attorney, Agent, or Firm* — Staas & Halsey LLP

(57) ABSTRACT

A printed circuit board (PCB) assembly includes a PCB, electronic components mounted on the PCB, a shield can provided to block electromagnetic waves of the electronic components, and an insulating layer provided to prevent an electrical short between the electronic components and the shield can, and the insulating layer is sprayed and formed on the shield can. The insulating layer which is sprayed and formed on the shield can does not have an adhesive layer, and thus the thickness thereof can be remarkably reduced compared to insulating materials requiring an adhesive layer.

26 Claims, 10 Drawing Sheets

PRINTED CIRCUIT BOARD ASSEMBLY AND METHOD OF MANUFACTURING THE SAME

CROSS-REFERENCE TO RELATED APPLICATIONS

This application claims the priority benefit of Korean Patent Application No. 10-2014-0102546, filed on Aug. 8, 2014 in the Korean Intellectual Property Office, the disclosure of which is incorporated herein by reference.

BACKGROUND

1. Field

The following description relates to a printed circuit board assembly and a method of manufacturing the same, and more particularly, to a printed circuit board assembly including a shield can in which an insulating layer is provided, and a method of manufacturing the same.

2. Description of the Related Art

In general, products such as various electronic devices, communication devices, and the like include various components and a printed circuit boards (PCB) which electrically connect each components. When the products are used, harmful radio waves are generated by various electronic components mounted on the PCB.

In the case of electromagnetic waves of the restricted harmful radio waves, for example, there is an environment compatibility test of testing whether the electromagnetic waves are compatible to the environment or not (electromagnetic compatibility (EMC)). The EMC is divided into two types.

The types include electromagnetic Interference (EMI) and electromagnetic susceptibility (EMS). Because the electromagnetic waves are harmful to the human body, the electromagnetic waves have been strictly restricted. Therefore, methods for preventing the electromagnetic waves from occurring through the strict restriction such as the EMC test have been proposed. Specifically, use of the shield can mounted on the PCB is essential.

In general, the shield can is provided to surround the electronic components mounted on the PCB. However, in recent years, high-density mounting is proceeding to miniaturize the products. Thus, distances between the electronic components and the shield can are reduced, which increases the risk of an electrical short between the electronic components and the shield can.

In order to prevent the electrical short therebetween, the insulating layer is formed on the shield can. In general, the insulating layer is formed by attaching insulating tape to the surfaces of the shield can. However, this method is disadvantageous to high-density mounting due to the thickness of the insulating tape. Furthermore, it is difficult to attach the insulating tape to the correct locations, and there is the risk of separation of the insulating tape in the surface mounting process or the like of the products.

Another method of forming the insulating layer includes a roll-to-roll laminating method on the metal plate of a shield can. However, in this method, an insulating layer is formed on the entire shield can, and the insulating layer is formed on parts that may not require insulation. Also, expensive equipment is required to form the insulating layer.

SUMMARY

Therefore, it is an aspect of the present disclosure to provide a printed circuit board (PCB) assembly including an insulating layer which is sprayed and formed on a shield can, and a method of manufacturing the same.

Furthermore, it is an aspect of the present disclosure to provide a PCB assembly including an insulating layer formed at a predetermined location as necessary, and a method of manufacturing the same.

Additional aspects of the disclosure will be set forth in part in the description which follows and, in part, will be obvious from the description, or may be learned by practice of the disclosure.

In accordance with an aspect of the present disclosure, a PCB assembly includes a PCB, electronic components mounted on the PCB, a shield can provided to block electromagnetic waves of the electronic components, and an insulating layer provided to prevent an electrical short between the electronic components and the shield can, and the insulating layer is sprayed and formed on the shield can.

The insulating layer may be formed on at least a part of the shield can.

The insulating layer may be sprayed and formed on one side of the shield can in a predetermined shape.

The insulating layer may be formed in a shape corresponding to each of the electronic components.

The insulating layer may be sprayed and formed on the shield can together with pressurized air.

The insulating layer may be sprayed and formed on the shield can in an ink jet method.

The insulating layer may be sprayed, applied, dried, and formed on the shield can.

The shield can may include a shield frame mounted on the PCB and a shield cover coupled to the shield frame.

The insulating layer may be sprayed and formed on the shield frame and the shield cover which are coupled to each other.

The insulating layer may be formed on at least one part of the shield frame and the shield cover which are coupled to each other.

The shield can may be installed on the PCB to surround the electronic components and the insulating layer may be formed between the electronic components and the shield can.

The insulating layer may be formed on one side of the shield can adjacent to upper parts of the electronic components.

The insulating layer may be sprayed on the shield can through an insulating nozzle.

In accordance with an aspect of the present disclosure, a PCB assembly includes a plurality of electronic components, a PCB in which the plurality of electronic components are mounted, a shield can disposed on the PCB to surround at least one of the plurality of electronic components, and an insulating layer applied, dried, and formed on a part of the shield can.

The shield can may be coupled to the PCB so that the at least one of the electronic components is located therein and the insulating layer may be disposed between the shield can and the at least one of the electronic components.

The insulating layer may be formed in a shape corresponding to the at least one of the electronic components.

The insulating layer may be sprayed and applied on the shield can.

In accordance with an aspect of the present disclosure, a method of manufacturing a PCB assembly includes coupling electronic components to a PCB, manufacturing a shield can in a predetermined shape in order to block electromagnetic waves from the electronic components, spraying an insulating liquid on one side of the shield can manufactured in the predetermined shape to form an insulating layer, and mounting the shield can in which the insulating layer is formed on the PCB in which the electronic components are mounted.

The insulating layer may be sprayed and formed on a predetermined location of the shield can through an insulating nozzle.

The insulating layer may be sprayed, applied, dried, and formed on one side of the shield can.

The insulating layer may be formed on at least a part of the shield can.

The shield can may be coupled and provided to each of the shield frame and the shield cover manufactured in predetermined shapes and the insulating layer may be formed on the shield frame and the shield cover which are coupled to each other.

The shield can may be mounted on the PCB so that the insulating layer is disposed adjacent to the electronic components.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
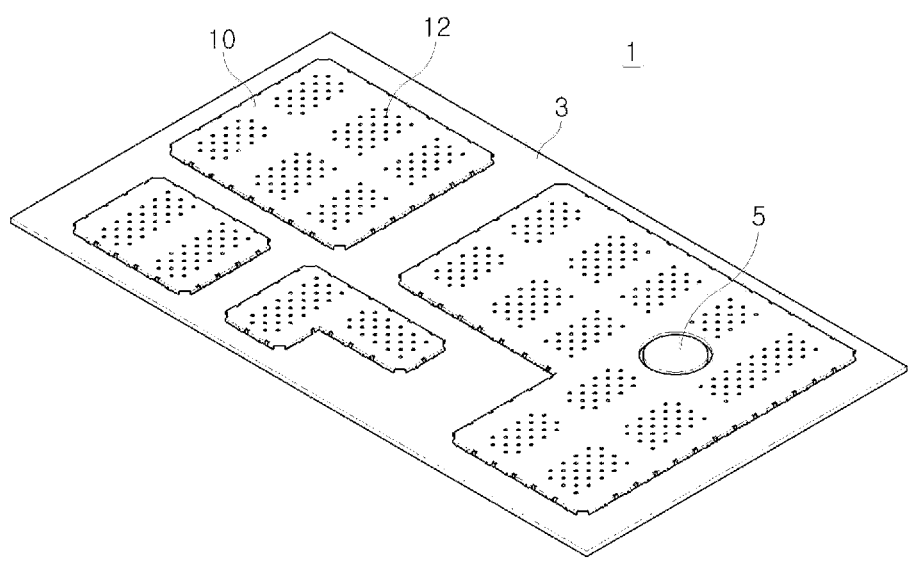
FIG. 1 is a schematic view showing a printed circuit board (PCB) assembly according to an embodiment of the present disclosure.

Reference will now be made in detail to the embodiments, examples of which are illustrated in the accompanying drawings, wherein like reference numerals refer to the like elements throughout. The embodiments are described below to explain the present disclosure by referring to the FIGS.

Hereinafter, embodiments of the present disclosure will be described in detail with reference to the accompanying drawings.

Figure 2:
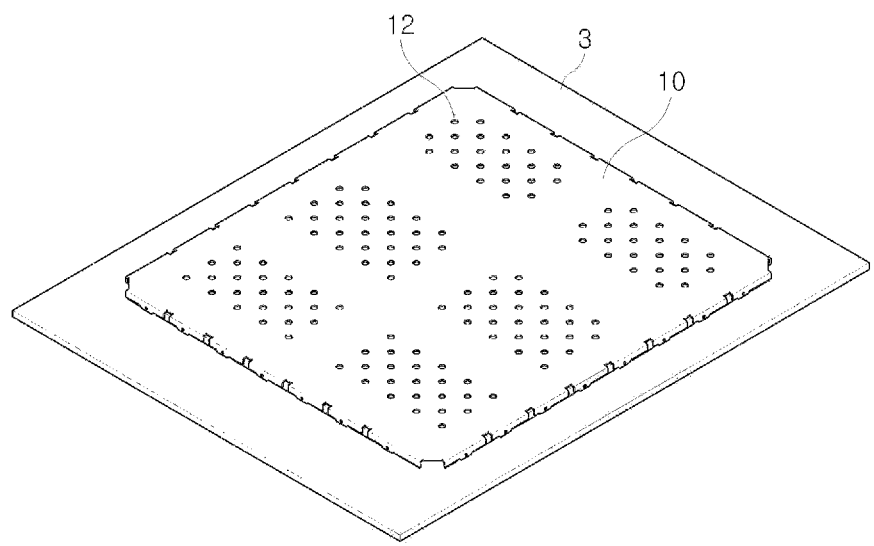
FIG. 2 is a view showing a shield can mounted on a PCB assembly according to an embodiment of the present disclosure.

FIG. 1 is a schematic view showing a printed circuit board (PCB) assembly according to an embodiment of the present disclosure. FIG. 2 is a view showing a shield can mounted on the PCB assembly according to the embodiment of the present disclosure. FIG. 2 illustrates a part of the PCB assembly to show any one of shield cans shown in FIG. 1.

The PCB assembly 1 includes a PCB 3, electronic components 5, and shield cans 10.

The PCB assembly 1 may be used in various products, such as a smart phone, a tablet, a laptop computer, a digital broadcasting terminal, a personal digital assistant (PDA), a portable multimedia player (PMP), a navigation unit, etc.

As shown in FIG. 1, the PCB 3 may be provided in a flat form to mount various types of electronic components 5. The PCB 3 may have a variety of forms and sizes as necessary. Bonding pads (not shown) in which the various electronic components 5 are mounted and circuits (not shown) printed to electrically connect the mounted electronic components 5 may be provided on a surface of the PCB 3.

The plurality of electronic components 5 may be mounted on the single PCB 3. The plurality of electronic components 5 may have a variety of forms and sizes. Furthermore, each of the electronic components 5 may be disposed at a predetermined location of the PCB 3.

In general, when a product operates, electromagnetic waves may be generated by the electronic components 5 disposed therein. The electromagnetic waves may cause problems, such as malfunctions between the electronic components due to the electromagnetic waves, or malfunctions caused by electromagnetic interference (EMI) due to external electromagnetic fields. Therefore, the shield cans 10 may be provided to block the electromagnetic waves generated by the electronic components 5.

The shield cans 10 may be installed on the PCB 3 to surround, or cover, the electronic components 5. Thus, internal interference of the electronic component 5 and radiation to the outside caused by the electromagnetic waves may be prevented. The shield cans 10 have various types, such as a screw type, a clip type, a cover type, and a frame type, for example.

The screw type is a type which couples the shield can to the PCB using a screw, and separately welds walls in order to protect the main electronic components.

The clip type includes a cover which surrounds components and a clip which fixes the cover to the PCB. Specifically, the clip is mounted on the PCB along the entire shape of the cover and then the cover is coupled to the clip.

The cover type includes only a cover which surrounds electronic components, and the cover itself is bonded to the PCB.

In general, the frame type that is frequently used for mobile products includes a cover which surrounds components and a frame coupled to the cover. Hereinafter, an example of the PCB assembly 1 including the shield cans 10 provided in the frame type will be described.

As shown in FIG. 1, the plurality of shield cans 10 may be disposed on the PCB 3. Each of the shield cans 10 may be provided in a variety of forms and sizes. The shield can 10 may be provided on the PCB 3 in a single form, which may result in a lot of materials being wasted.

Furthermore, in general, when a product operates, heat may be generated in the electronic components 5 together with the electromagnetic waves. Because the shield cans 10 are installed to surround the electronic component 5 in order to block the electromagnetic waves of the electronic components 5, the shield cans 10 may impede heat dissipation of the electronic components 5. Therefore, the plurality of shield cans 10 may be installed on only parts where shielding is essential. Furthermore, each of the shield cans 10 may include a plurality of heat dissipation holes 12 to emit heat.

The electronic components 5 may be formed in various heights and installed on the PCB 3. The shield can 10 may not be installed to be in contact with the electronic components 5 due to the problem such as an electrical short with the electronic components 5. Therefore, the shield cans 10 should be formed to be higher than the highest electronic component 5 when measured from the PCB.

Therefore, when a height of any one of the electronic components 5 is high, a total height of the shield cans 10 is accordingly increased, and thus, it is disadvantageous to miniaturization and high density of the product. As shown in FIG. 1, any one of the shield cans 10 may be formed so that the electronic component 5 having a high height is exposed through the shield can.

Therefore, electromagnetic shielding and heat dissipation of the electronic components 5 and the height of the product may be formed in an appropriate condition. Thus, the shield can 10 may be provided in various forms. Hereinafter, any one of the shield cans 10 installed on the PCB 3 will be described.

Figure 3:
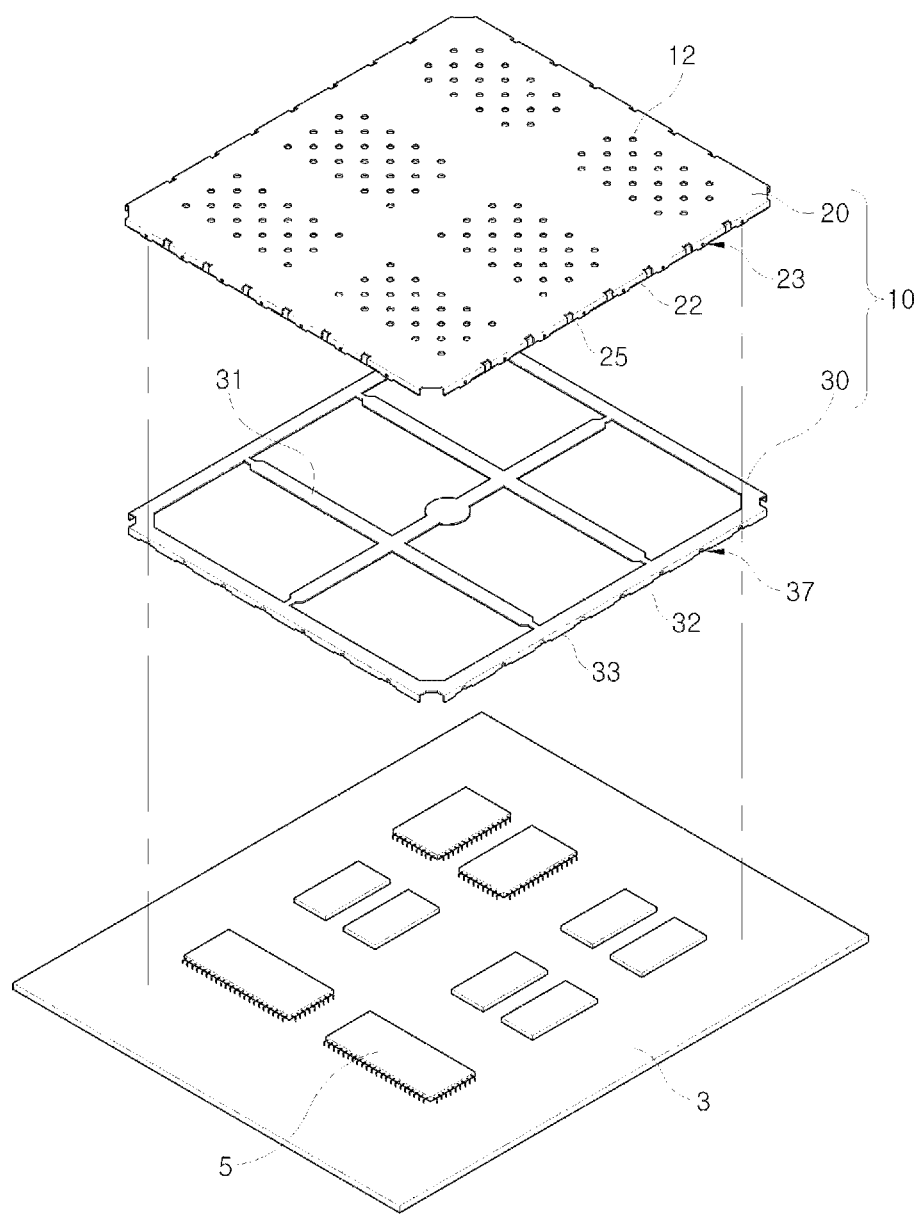
FIGS. 3 and 4 are exploded views showing a shield can of a PCB assembly according to an embodiment of the present disclosure.
Figure 4:
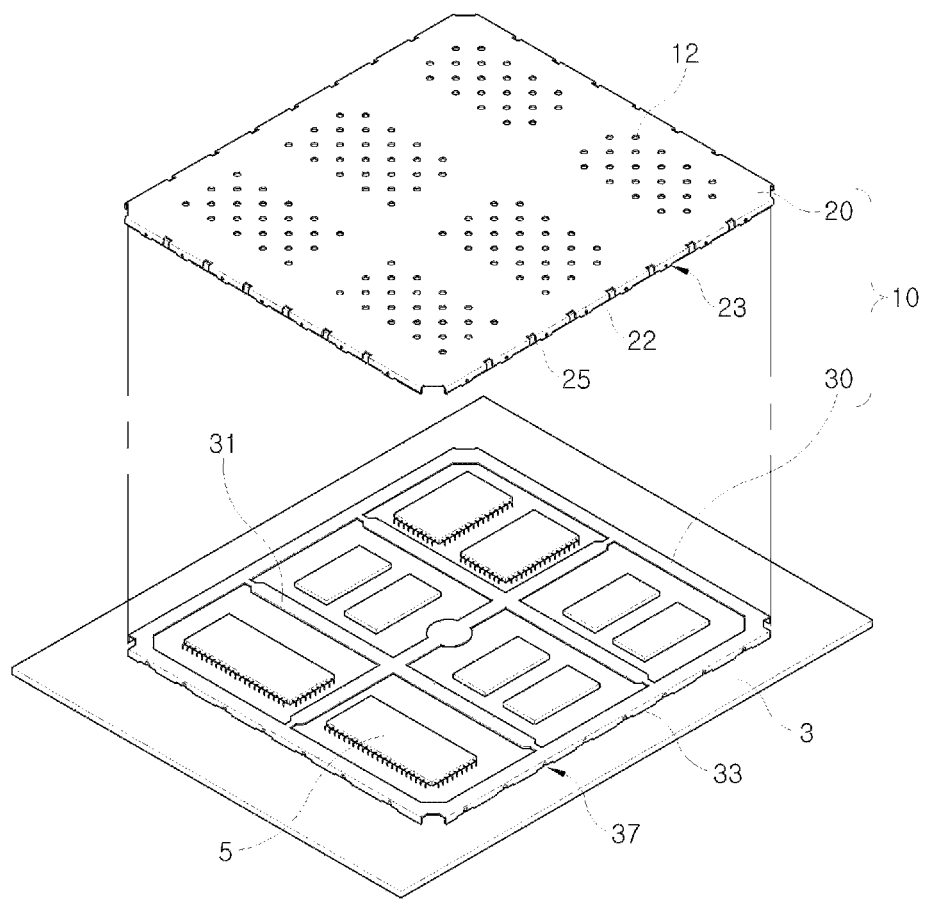

FIGS. 3 and 4 are exploded views showing the shield can of the PCB assembly according to the embodiment of the present disclosure.

As described above, the shield can 10, which is provided in a frame type, according to the embodiment of the present disclosure may include a shield frame 30 and a shield cover 20.

As shown in FIG. 4, the shield frame 30 may be mounted on a PCB 3. The shield frame 30 may be fixed to the PCB 3. The shield can 10 may be stably mounted on the PCB 3 due to the shield frame 30. Furthermore, the shield frame 30 may support the shield cover 20 and thus may prevent the shield cover 20 from being changed by an external force and its own weight.

For example, the shield frame 30 may be fixed, or attached, to the PCB 3 through welding. Furthermore, the shield frame 30 may be fixed to the PCB 3 in various methods such as soldering, bonding, clip or screw coupling, etc.

The shield frame 30 may be made of a material surface-treated with nickel, tin, gold, silver, copper, or the like on a surface of nickel silver, phosphor bronze, or stainless steel. However, the disclosure is not limited to the above examples, and the shield frame 30 may be made of any material having high conductivity without causing chemical changes.

The shield cover 20 may be coupled to the shield frame 30. The shield cover 20 may surround the outside of the shield frame 30 exposed when the shield frame is attached to the PCB. The shield cover 20 may be made of a material such as stainless steel having high electrical conductivity.

The shield frame 30 and the shield cover 20 may be detachably provided. As described above, the shield frame 30 is fixed to the PCB 3 and the shield cover 20 is detachably coupled to the shield frame 30. Thus, as shown in FIG. 4, the shield cover 20 may be removed from the PCB assembly 1 and thus the electronic components 5 may be easily repaired and exchanged.

The shield frame 30 and the shield cover 20 may include coupling parts 23 and 37, respectively, for coupling detachably to each other. Hereinafter, a coupling part provided in the shield frame 30 is called a first coupling part 37 and a coupling part provided in the shield cover 20 is called a second coupling part 23.

The plurality of first coupling parts 37 and the plurality of second coupling parts 23 may be provided. Each of the first coupling part 37 and the second coupling part 23 may be formed at a corresponding location of the shield frame 30 and the shield cover 20, respectively. The first coupling part 37 and the second coupling part 23 may be formed on side surfaces of the shield frame 30 and the shield cover 20, respectively.

Furthermore, the shield frame 30 includes fixing parts 33 provided to fix to the PCB 3. The plurality of fixing parts 33 may be disposed on the side surfaces of the shield frame 30. The fixing parts 33 may be spaced a predetermined distance from each other and provided on bottom side surfaces of the shield frame 30.

The first coupling parts 37 and the fixing parts 33 may be alternately disposed on the side surfaces of the shield frame 30 so as not to overlap. Therefore, when the shield frame 30 and the shield cover 20 are detachably coupled and fixed to the PCB 3, interference between each other cannot be generated.

In each drawing, as an example, it is shown that the coupling parts 23 and 37 for fixing the shield cover 20 and the shield frame 30 are each shown to have eight parts on each side surface thereof. However, the present disclosure is not limited thereto, and the coupling parts 23 and 37 may be formed in various sizes and numbers according to the size and shape of the shield can 10.

Hereinafter, a coupling structure of the shield cover and the shield frame and a coupling to the PCB will be described in detail.

Figure 5:
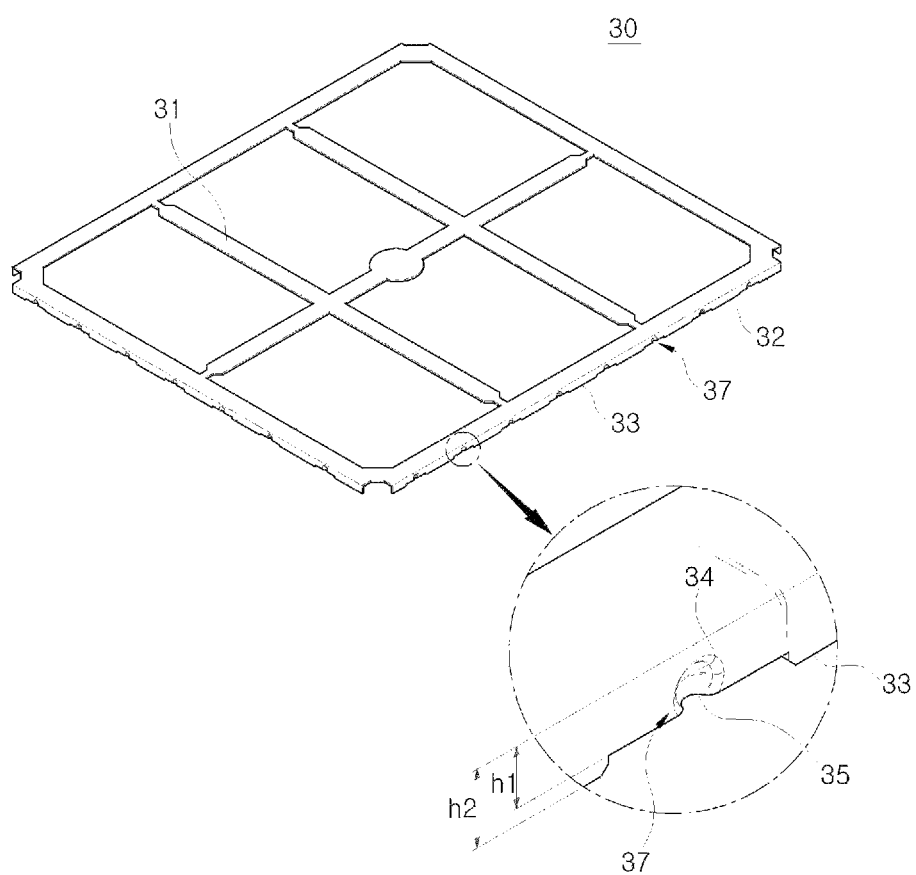
FIG. 5 is a view showing a shield frame of a PCB assembly according to an embodiment of the present disclosure.

FIG. 5 is a view showing the shield frame of the PCB assembly according to the embodiment of the present disclosure.

The shield frame 30 may be disposed at the outside of the electronic components 5 so that the shield can 10 may surround the outside of the electronic components 5.

The shield frame 30 may include an upper surface 31, a frame side surface part 32 which is bent and formed in a downward direction from edges of the upper surface 31, and a plurality of first coupling parts 37 formed on the frame side surface part 32.

The first coupling part 37 may include coupling grooves 34 formed on the frame side surface part 32. The coupling grooves 34 are formed to protrude in an inward direction of the shield frame 30. Each of the coupling grooves 34 may be formed in at least any one shape of a circular shape, a semi-circular shape, and an oval shape.

The coupling groove 34 may include a cut part 35 of which at least a part of a bottom thereof is cut. The cut part 35 may be formed on the bottom of the coupling groove 34. Due to the cut part 35, a height h1 of a part of the shield frame 30 in which the coupling groove 34 is formed may be smaller than a height h2 of a part of the shield frame 30 in which the fixing part 33 is formed.

Figure 6:
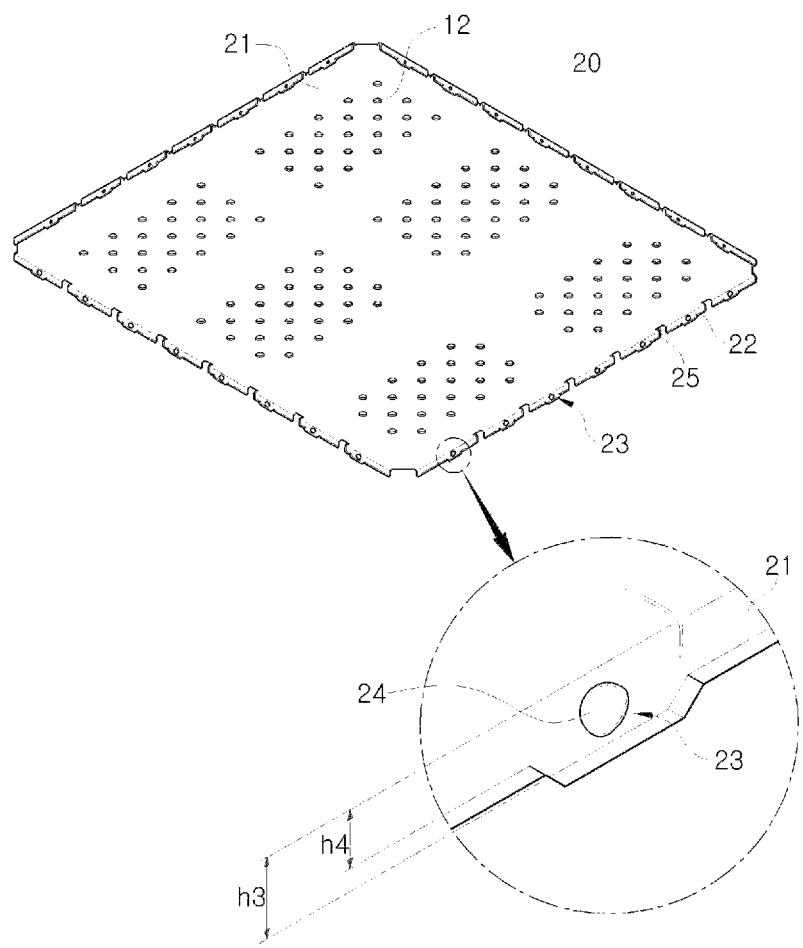
FIG. 6 is a view showing a shield cover of a PCB assembly according to an embodiment of the present disclosure.

FIG. 6 is a view showing the shield cover of the PCB assembly according to the embodiment of the present disclosure.

The shield cover 20 may include a shield cover surface 21, a shield cover side surface part 22 which is bent and formed in a downward direction from edges of the shield cover surface 21, and a plurality of second coupling parts 23 formed on the shield cover side surface part 22.

The second coupling parts 23 may be formed at locations corresponding to the first coupling parts 37 of the shield frame 30. The second coupling part 23 may include a coupling protrusion 24 which is formed to protrude in an inward direction from the shield cover side surface part 22 to correspond to the first coupling part 37. The coupling protrusion 24 may be formed in at least any one shape of a circular shape, a semi-circular shape, and an oval shape to correspond to the shape of the coupling groove 34.

A height h3 of the shield cover side surface part 22 in which the second coupling part 23 is formed may be greater than a height h4 of the shield cover side surface part 22 not having the second coupling part 23.

Furthermore, a plurality of slots 25 may be provided on the shield cover side surface part 22 disposed at a predetermined distance from each other. The plurality of slots 25 may be cut and formed in a direction perpendicular to the bottom of the shield cover side surface part 22, and disposed to be spaced a predetermined distance from each other.

The second coupling part 23 may be formed between the slots 25. When the first coupling part 37 and the second coupling part 23 are attached and detached, the slots 25 may help so that the shield cover side surface part 22 is easily elastically changed.

Figure 7:
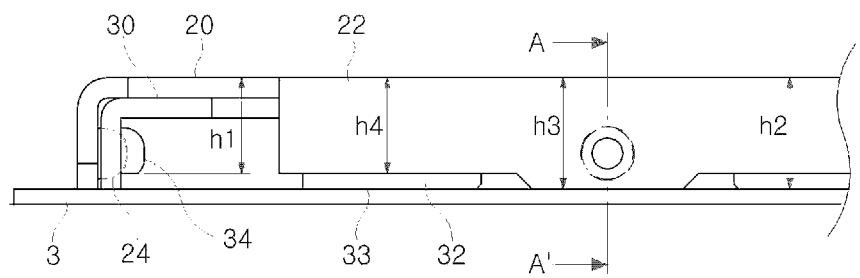
FIG. 7 is a view showing a coupled shield frame and a shield cover of a PCB assembly according to an embodiment of the present disclosure.
Figure 8:
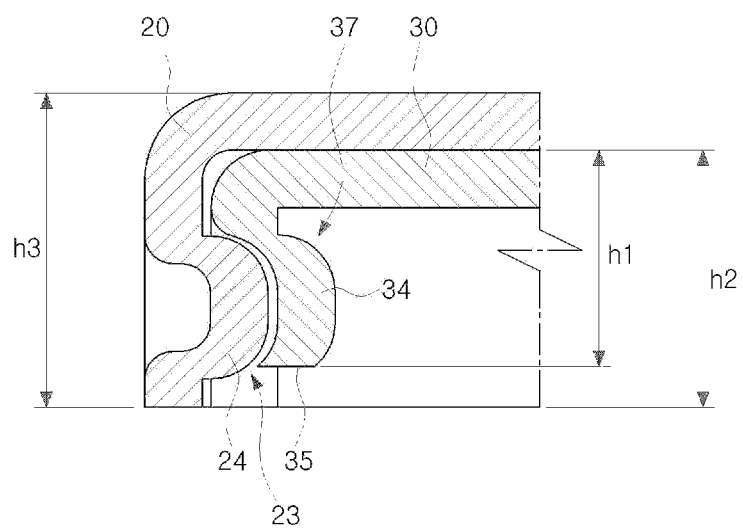
FIG. 8 is a view showing a cross section taken along line A-A' of FIG. 7.

FIG. 7 is a view showing a combination of the shield frame and the shield cover of the PCB assembly according to the embodiment of the present disclosure. FIG. 8 is a view showing a cross-section taken along line A-A' of FIG. 7.

As shown in FIG. 7, the height h3 of the shield cover 20 in which the second coupling part 23 is formed may be less than or equal to the height h2 of the shield frame 30 in which the fixing part 33 is formed. Furthermore, the height h3 of the shield cover 20 in which the second coupling part 23 is formed may be greater than the height h4 of the shield cover side surface part 22.

Thus, a full height of the shield can 10 mounted on the PCB 3 may be small, and thus the product may be slim.

Meanwhile, the coupling protrusion 24 of the shield cover 20 may be inserted into the coupling groove 34 of the shield frame 30 and thus the shield frame 30 may be fixed to the shield cover 20. In this case, the coupling protrusion 24 of the second coupling part 23 may be easily separated from the coupling groove 34 due to the cut part 35 formed on the bottom of the coupling groove 34 of the first coupling part 37.

When the shield frame 30 and the shield cover 20 are coupled to each other, the height h4 of the shield cover 20 in which the second coupling part 23 is formed and the height h1 of the shield frame 30 in which the fixing part 33 is formed may be formed on the same line. Thus, when the shield frame 30 is fixed to the PCB 3, gaps or empty spaces between the shield cover 20 and the PCB 3 may be minimized.

Figure 9:
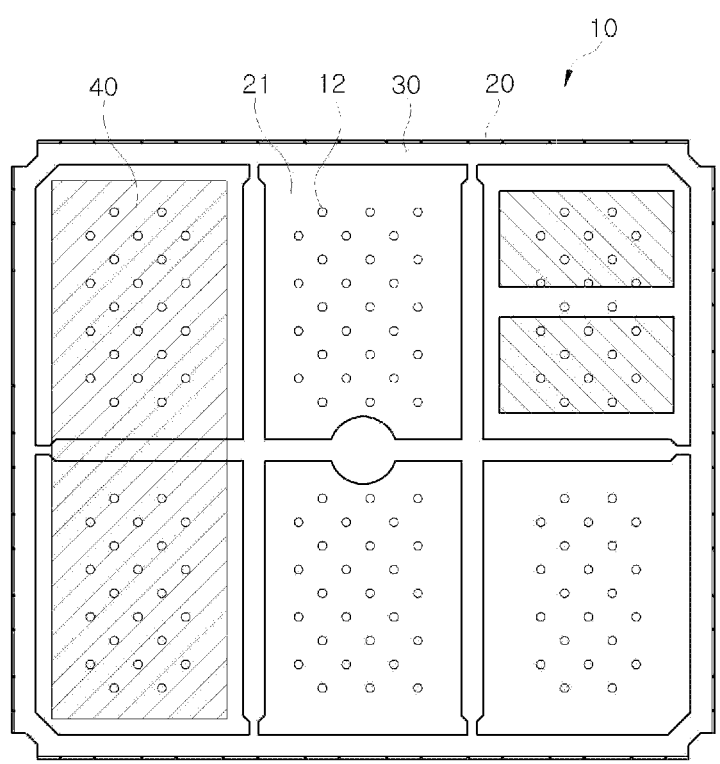
FIG. 9 is a view showing an insulating layer of a PCB assembly according to an embodiment of the present disclosure.

FIG. 9 is a view showing an insulating layer of the PCB assembly according to the embodiment of the present disclosure.

An electrical short, or connection, may occur between the electronic component 5 and the shield can 10. Specifically, due to high-density mounting of the product, a distance between the electronic component 5 and the shield can 10 is reduced, and thus the risk of the electrical short is increased. Thus, the PCB assembly 1 may include an insulating layer 40 provided to prevent the electrical short between the electronic component 5 and the shield can 10.

The insulating layer 40 may be located between the electronic component 5 and the shield can 10 in order to prevent the electrical short between the electronic component 5 and the shield can 10. Specifically, the insulating layer 40 may be formed on one side of the shield can 10 adjacent to an upper part of the electronic component 5.

As shown in FIG. 9, the insulating layer 40 may be formed on one surface of the shield can 10 on which the shield cover surface 21 is provided. Furthermore, the insulating layer 40 may be formed on the coupled shield frame 30 and the shield cover 20. Of course, the insulating layer 40 may be formed on each of the shield frame 30 and the shield cover 20.

The insulating layer 40 may be sprayed and formed on the shield can 10. Specifically, the insulating layer 40 may be sprayed, applied, dried, and formed on the shield can 10.

An insulating liquid for forming the insulating layer 40 may include a polymer resin-based ink. Specifically, the insulating liquid may include a polyimide-based resin. Furthermore, the insulating liquid may include a polyimide-based resin such as polyurethane, epoxy, etc. It is just one example, and the insulating layer 40 may be formed with a variety of insulating liquid having high insulation without causing chemical changes in the shield can 10.

Figure 10:
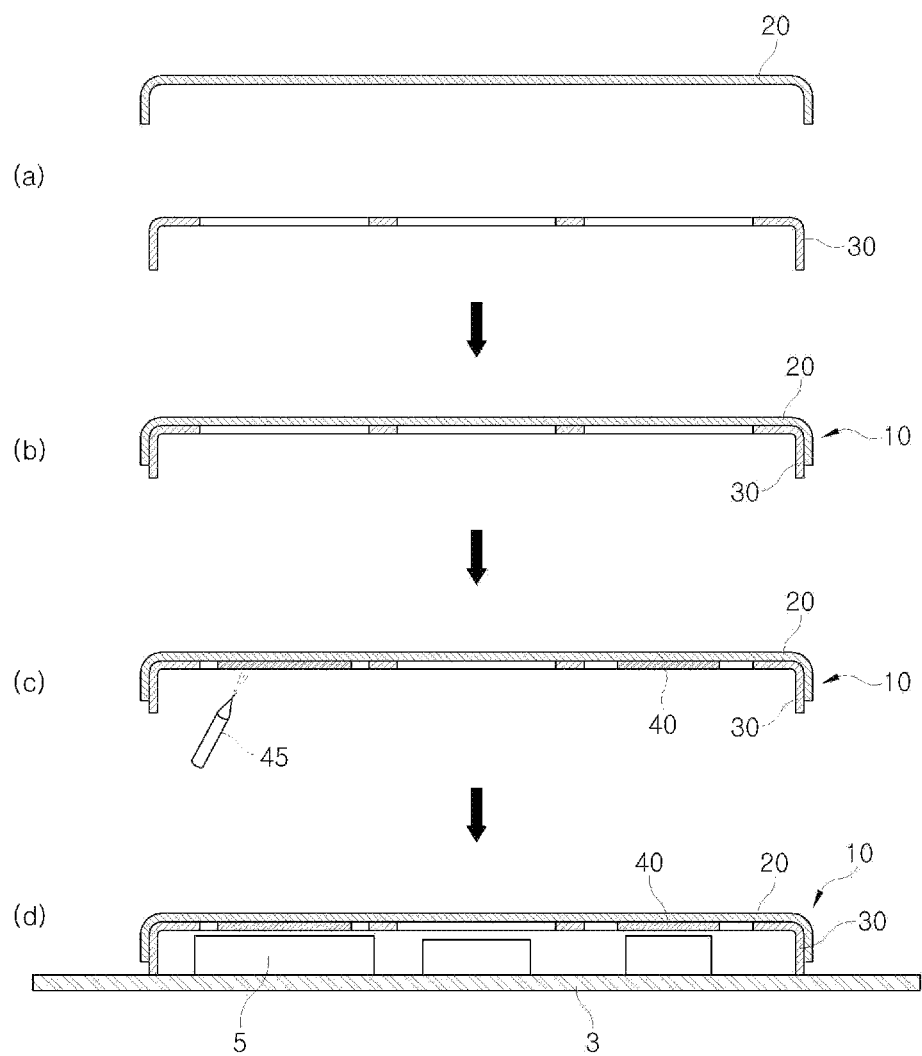
FIG. 10 is a view showing a method of manufacturing a PCB assembly according to an embodiment of the present disclosure.

The insulating layer 40 may be sprayed and formed on the shield can 10 through an insulating nozzle 45 (shown in FIG. 10). For example, the insulating layer 40 may be sprayed and formed on the shield can 10 together with pressurized air. Specifically, the insulating layer 40 may be sprayed and formed on the shield can 10 in an ink jet method. It is just one example, and the insulating layer 40 may be formed in various methods for spraying and forming.

The insulating layer 40 may be sprayed and formed on the shield can 10 through the insulating nozzle 45 in a non-contact method. Therefore, the insulating layer 40 may be formed regardless of assembly operation differences even in a state in which the shield frame 30 and the shield cover 20 are assembled.

Furthermore, the insulating layer 40 may be accurately formed at a desired location of the shield can 10 through the insulating nozzle 45. Therefore, the insulating layer 40 may be formed on a portion of the shield can 10. As shown in FIG. 9, the insulating layer 40 is sprayed and formed on the shield can 10 in a predetermined shape. The shape corresponds to the shape of each of the electronic components 5.

Because the heights of the electronic components 5 are different, the insulating layer 40 may be formed on a part in which the highest electronic component 5 is located. This is because, in the case of the electronic component 5 having a high height, a distance between the electronic component 5 and the shield can 10 is short and thus an electrical short is likely to occur. As described above, the insulating layer 40 may be formed on only the needed portion of the shield can 10.

The insulating layer 40 which is sprayed and applied on the shield can 10 may be dried through a curing process. The curing process may be performed using heat, infrared rays, etc.

FIG. 10 is a view showing a method of manufacturing a PCB assembly according to an embodiment of the present disclosure. The method of manufacturing the PCB assembly will be schematically described with reference to FIG. 10.

As shown in FIG. 10A, a shield frame 30 and a shield cover 20 may be formed. The other type of the shield can 10 may include only the shield cover 20 or may be provided in various forms. The shield can 10 is formed in various shapes of blocking electromagnetic waves of electronic components 5.

As shown in FIG. 10B, the formed shield frame 30 and shield cover 20 are coupled to each other to form the shield can 10. The coupling structure of the shield can 10 has been described above. A schematic coupling structure is shown in FIG. 10, and thus the coupling structure of the shield can 10 is omitted.

As shown in FIG. 10C, an insulating layer 40 is formed on one side of the shield can 10 provided in a predetermined shape. The insulating liquid may be sprayed on the shield can 10 through an insulating nozzle 45 and the insulating layer 40 may be formed at a predetermined location of the shield can 10. Specifically, the insulating layer 40 may be sprayed, applied, dried, and formed on the one side of the shield can 10.

As shown in FIG. 10D, the shield can 10 in which the insulating layer 40 is formed is mounted on the PCB 3. The shield can 10 may be coupled to the PCB 3 so that the insulating layer 40 is located between the electronic components 5 and the shield can 10. The shield frame 30 may be fixed to the PCB 3 to support the shield cover 20.

The insulating layer which is sprayed and formed on the shield can does not have an adhesive layer, and thus the thickness thereof can be remarkably reduced compared to adhesive insulating tape, for example.

Furthermore, the insulating layer can be formed on the shield can in a non-contact method, and thus the insulating layer can be formed at only a needed location.

While the present disclosure has been mainly described with reference to a specific shape, it will be understood by those of skilled in the art that various modifications and changes may be made and the modifications and changes are defined within the scope of the present disclosure.

Although a few embodiments have been shown and described, it would be appreciated by those skilled in the art that changes may be made in these embodiments without departing from the principles and spirit of the disclosure, the scope of which is defined in the claims and their equivalents.

What is claimed is:

1. A printed circuit board (PCB) assembly comprising:
a PCB;
an electronic component mounted on the PCB;
a shield can provided to block electromagnetic waves generated by the electronic component; and
a sprayed-on insulating layer provided directly on the shield can to prevent an electrical connection between the electronic component and the shield can,
wherein the shield can comprises a shield frame mounted on the PCB and a shield cover coupled to the shield frame, and
the sprayed-on insulating layer is sprayed and formed on the shield frame and the shield cover while the shield frame and the shield cover are coupled.

2. The PCB assembly according to claim 1, wherein the insulating layer is formed on a portion of the shield can.

3. The PCB assembly according to claim 1, wherein the insulating layer is sprayed and formed on one side of the shield can in a predetermined shape.

4. The PCB assembly according to claim 3, wherein the insulating layer is formed in a shape corresponding to the electronic component.

5. The PCB assembly according to claim 1, wherein the insulating layer is sprayed and formed on the shield can using pressurized air.

6. The PCB assembly according to claim 1, wherein the insulating layer is sprayed and formed on the shield can using an ink jet method.

7. The PCB assembly according to claim 1, wherein the insulating layer is sprayed, applied, dried, and formed on the shield can.

8. The PCB assembly according to claim 1, wherein the insulating layer is sprayed and formed on a portion of the shield frame and the shield cover.

9. The PCB assembly according to claim 1, wherein:
the shield can is installed on the PCB to cover the electronic component; and
the insulating layer is formed between the electronic component and the shield can.

10. The PCB assembly according to claim 9, wherein the insulating layer is formed on one side of the shield can adjacent to an upper part of the electronic component.

11. The PCB assembly according to claim 1, wherein the insulating layer is sprayed on the shield can using an insulating nozzle.

12. The PCB assembly according to claim 1, wherein the insulating layer is formed to have a step corresponding to a step formed by assembling of the shield frame and the shield cover.

13. A printed circuit board (PCB) assembly, comprising:
a plurality of electronic components;
a PCB on which the plurality of electronic components are mounted;
a shield can disposed on the PCB to cover at least one of the plurality of electronic components; and
an insulating layer applied, dried, and formed on a portion of the shield can,
wherein the shield can comprises a shield frame configured to mount on the PCB and a shield cover configured to detachably couple to the shield frame, and
the insulating layer is sprayed and formed on the shield frame and the shield cover while the shield frame and the shield cover are coupled.

14. The PCB assembly according to claim 13, wherein:
the shield can is coupled to the PCB to enclose the at least one of the electronic components; and
the insulating layer is disposed between the shield can and the at least one of the electronic components.

15. The PCB assembly according to claim 14, wherein the insulating layer is formed in a shape corresponding to the at least one of the electronic components.

16. The PCB assembly according to claim 13, wherein the insulating layer is sprayed and applied on the shield can.

17. A method of manufacturing a printed circuit board (PCB) assembly, the method comprising:
mounting an electronic component on a PCB;
spraying an insulating liquid on one side of a shield can, manufactured in a predetermined shape to block electromagnetic waves of the electronic component, to form an insulating layer; and
mounting the shield can with the insulating layer on the PCB with the electronic component,
wherein the shield can includes a shield frame and a shield cover respectively manufactured in predetermined shapes and coupled to each other,
the insulating layer is sprayed and formed on the shield frame and the shield cover while the shield frame and the shield cover are coupled, and
the insulating layer is formed to have a step corresponding to a step formed by assembling of the shield frame and the shield cover.

18. The method according to claim 17, wherein the insulating layer is sprayed and formed on a predetermined location of the shield can using an insulating nozzle.

19. The method according to claim 17, wherein the insulating layer is sprayed, applied, dried, and formed on one side of the shield can.

20. The method according to claim 17, wherein the insulating layer is formed on at least a portion of the shield can.

21. The method according to claim 17, wherein:
the shield can includes a shield frame and a shield cover manufactured in predetermined shapes respectively; and the insulating layer is formed on the shield frame and the shield cover.

22. The method according to claim 17, wherein the shield can is mounted on the PCB so that the insulating layer is disposed adjacent to the electronic component.

23. A shield can, comprising:
- a shielding layer comprising a shielding material having high electrical conductivity to block electromagnetic waves from an electronic component; and
- a sprayed-on insulating layer comprising an insulating material formed directly on the shielding layer,
- wherein the shielding layer comprises a shield frame configured to mount on a printed circuit board and a shield cover configured to detachably couple to the shield frame, and
- the sprayed-on insulating layer is sprayed and formed on the shield frame and the shield cover while the shield frame and the shield cover are coupled.

24. The shield can of claim 23, wherein the shielding material comprises stainless steel.

25. The shield can of claim 23, wherein the insulating material comprises a sprayable polyimide-based resin.

26. The shield can according to claim 23, wherein the sprayed-on insulating layer is formed to have a step corresponding to a step formed by assembling of the shield frame and the shield cover.

* * * * *